United States Patent [19]
Chaplik et al.

[11] Patent Number: 5,412,353
[45] Date of Patent: May 2, 1995

[54] PHASE-LOCKED LOOP FREQUENCY MODULATION CIRCUIT FOR INPUT MODULATION SIGNALS HAVING LOW-FREQUENCY CONTENT

[75] Inventors: Naom Chaplik; Steven H. Gardner; Seton P. Kasmir, all of San Diego, Calif.

[73] Assignee: Pacific Communication Sciences, Inc., San Diego, Calif.

[21] Appl. No.: 152,445

[22] Filed: Nov. 12, 1993

[51] Int. Cl.$^6$ .............................. H03C 3/08; H03L 7/06
[52] U.S. Cl. ..................................... 332/127; 332/100; 375/296; 375/303; 455/110; 331/17; 331/23
[58] Field of Search .............. 332/100, 123, 126, 128, 332/101–105, 127; 331/17, 23; 375/45, 51, 60, 62, 120; 455/110, 111, 112, 113

[56] References Cited

U.S. PATENT DOCUMENTS

| | | | |
|---|---|---|---|
| 4,052,672 | 10/1977 | Enderby et al. | 325/147 |
| 4,242,649 | 12/1980 | Washburn, Jr. | 332/18 |
| 5,281,930 | 1/1994 | Taromaru et al. | 332/127 |

*Primary Examiner*—David Mis
*Attorney, Agent, or Firm*—Edward W. Callan

[57] ABSTRACT

A phase-locked loop frequency modulation circuit that compensates for the inability of a phase-locked loop to pass low-frequency content of an input modulation signal, and that may be utilized with existing communication apparatus, such as a cellular telephone voice radio, for accurate data transmission without having to modify such apparatus, includes a compensation circuit for processing an input modulation signal to provide a compensation signal that is added to a loop filter output signal by processing the input modulation signal to provide the same effect as adding the input modulation signal to an integrated input modulation signal that is filtered by a filter having the same transfer function as the loop filter to provide the compensation signal.

3 Claims, 2 Drawing Sheets

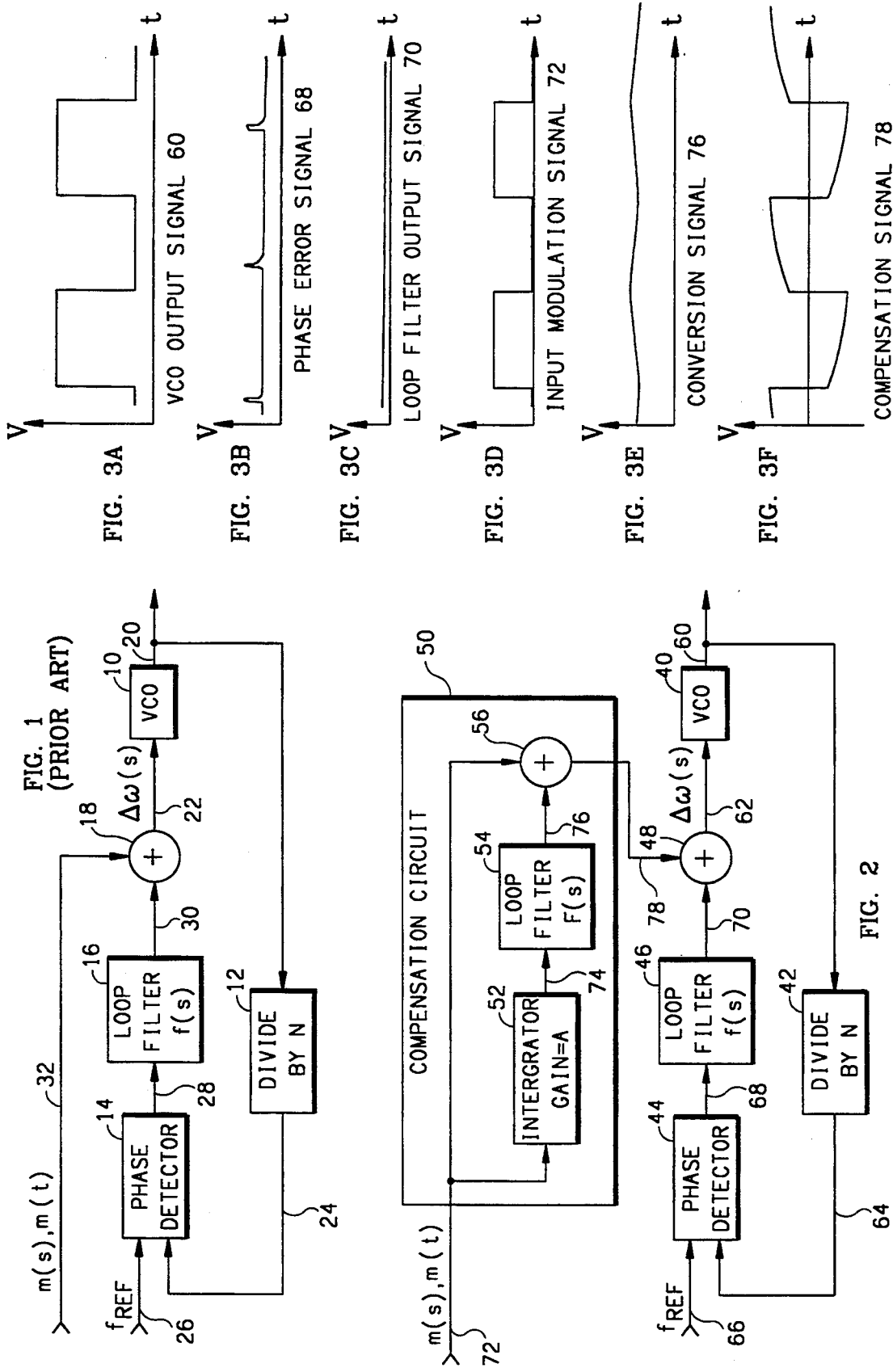

PHASE-LOCKED LOOP FREQUENCY MODULATION CIRCUIT FOR INPUT MODULATION SIGNALS HAVING LOW-FREQUENCY CONTENT

BACKGROUND OF THE INVENTION

The present invention generally pertains to phase-locked loop frequency modulation circuits and is particularly directed to frequency modulation with an input modulation signal having a low-frequency content.

A typical prior art phase-locked loop frequency modulation circuit, as shown in FIG. 1, includes a voltage controlled oscillator (VCO) 10, a frequency divider 12, a phase detector 14, a loop filter 16 and an adder 18. The VCO 10 provides an output signal 20 having a given frequency in accordance with the voltage of a control signal 22 provided to the input of the VCO 10. The frequency divider 12 divides the given frequency of the VCO output signal 20 by an integer N to provide a frequency-divided VCO output signal 24 having a frequency that is near the frequency $f_{REF}$ of a reference frequency signal 26. The phase detector 14 compares the phase of the frequency-divided VCO output signal 24 with the phase of the reference frequency signal 26 to provide a phase error signal 28 that is indicative of a phase difference between the reference frequency signal 26 and the VCO output signal 20. The loop filter 16 filters the phase error signal 28 to provide a loop filter output signal 30. The adder 18 adds the loop filter output signal 30 to an input modulation signal 32 having a content m(t) to provide the control signal 22 that is provided to the input of the VCO 10 to frequency modulate the output signal 20 that is provided by the VCO 10 at the given frequency. Depending upon the particular implementation, the given frequency of the VCO output signal 20 may be centered at the frequency of a broadcast transmission channel or at some intermediate frequency.

Phase-locked loop frequency modulation circuits are used in many applications, including radios for cellular broadcast systems. The content m(t) of the input modulation signal 32 is a voltage that varies in amplitude. Although a typical phase-locked loop frequency modulation circuit performs satisfactorily when the input modulation signal has its content m(t) derived from a voice signal, the transfer function of a typical phase-locked loop frequency modulation circuit is such that the typical circuit does not perform satisfactorily when the input modulation signal has its content m(t) derived from a data signal having a significant low-frequency content, i.e. a data signal having significant energy at frequencies approaching DC, which occurs for a digital data signal when there is an uneven distribution of one-bits and zero-bits. The transfer function of the typical phase-locked loop frequency modulation circuit, as shown in FIG. 1, is:

$$\Delta\omega(a)/m(s) = K_o / [1 + K_o K_d f(s)/s], \quad (1)$$

wherein $K_o$ is the gain of the VCO, $K_d$ is the gain of the phase detector and $\omega$ is proportional to frequency.

This transfer function goes to zero as s goes to zero, which means that the phase-locked loop does not pass the low-frequency content of the input modulation signal, whereby for a digital data signal having an uneven distribution of one-bits and zero-bits, the bit error performance is degraded.

A solution to this problem is to provide a phase-locked loop frequency modulation circuit having a transfer function that is constant for all frequencies. This will occur if the transfer function is:

$$\Delta\omega(s)/m(s) = K_o[1 + Af(s)/s]/[1 + K_oK_df(s)/s], \quad (2)$$

wherein $A = K_oK_d$.

Phase-locked loop frequency modulation circuits having constant transfer functions have been described in U.S. Pat. Nos. 4,052,672 to Enderby et al. and 4,242,649 to Washburn, Jr. Enderby et al. described further adding an integrated input modulation signal to the phase error signal at the input of the loop filter; and Washburn, Jr. described further adding a compensated input modulation signal to the phase error signal at the input of the loop filter, with the compensated input modulation signal being provided by processing the input modulation signal to compensate for the transfer functions of the loop components. Washburn, Jr. also alternatively described adding the compensated input modulation signal into the loop at the first node available after the input to the loop filter when an integrated circuit in which the phase-locked loop is embodied does not have an available pin at the input of the loop filter.

SUMMARY OF THE INVENTION

The present invention provides a frequency-modulation circuit, comprising a phase-locked loop, including a voltage controlled oscillator (VCO) for providing an output signal having a given frequency; means for adding a compensation signal to a loop filter output signal to provide a control signal to the VCO for controlling the frequency of the VCO output signal; means for processing an output signal from the VCO with a reference frequency signal to provide a phase error signal indicative of a phase difference between the reference frequency signal and the VCO output signal; and a loop filter having a predetermined transfer function for filtering the phase error signal to provide the loop filter output signal that is added to the compensation signal; and a compensation circuit for processing an input modulation signal to provide the compensation signal that is added to the loop filter output signal by processing the input modulation signal to provide the same effect as adding the input modulation signal to an integrated input modulation signal that is filtered by a filter having said predetermined transfer function to provide the compensation signal.

For the phase-locked loop frequency modulation circuit of the present invention, the ideal circuit of which is shown in FIG. 2, $$\Delta\omega(s) = m(s) + [m(s)/s]AF(s) - \Delta\omega(s)[K_oK_d/sN]f(s), \quad (3)$$

wherein $K_o$ is the gain of the VCO and $K_d$ is the gain of the phase detector;

or, $$\Delta\omega(s)\{1 + [K_oK_d/sN]f(s)\} = m(s)\{1 + [AF(s)]/s\}.$$

Therefore, the transfer function for the phase-locked loop frequency modulation circuit of the present invention is:

$$\Delta\omega(s)/m(s) = K_o[1 + AF(s)/s]/[1 + K_oK_d f(s)/sN].$$

Thus, when $A = K_o K_d$ and $F(s) = f(s)$, the transfer function, $\Delta\omega(s) / m(s)$ is constant for all frequencies. Accordingly, the phase-locked loop frequency modulation circuit of the present invention performs frequency modulation satisfactorily even when the input modulation signal has significant energy at frequencies approaching zero.

The frequency modulation circuit of the present invention can be constructed by combining the compensation circuit with a typical phase-locked loop.

The frequency modulation circuit of the present invention accurately compensates for the inability of a phase-locked loop to pass low-frequency content of an input modulation signal, and may be utilized with existing communication apparatus, such as a cellular telephone voice radio, for accurate data transmission without having to modify such apparatus.

Additional features of the present invention are described with reference to the description of the preferred embodiment.

BRIEF DESCRIPTION OF THE DRAWING

FIG. 1 is a block diagram of a typical prior art phase-locked loop frequency modulation circuit.

FIG. 2 is an equivalent block diagram of a phase-locked loop frequency modulation circuit according to the present invention.

FIG. 3A illustrates the waveform of the VCO output signal produced in the frequency modulation circuit of FIG. 2.

FIG. 3B illustrates the waveform of the phase error signal produced in the frequency modulation circuit of FIG. 2.

FIG. 3C illustrates the waveform of the loop filter output signal produced in the frequency modulation circuit of FIG. 2.

FIG. 3D illustrates the waveform of the input modulation signal provided to the frequency modulation circuit of FIG. 2.

FIG. 3E illustrates the waveform of the conversion signal produced in the frequency modulation circuit of FIG. 2.

FIG. 3F illustrates the waveform of the compensation signal produced in the frequency modulation circuit of FIG. 2.

DETAILED DESCRIPTION

Figure 4:
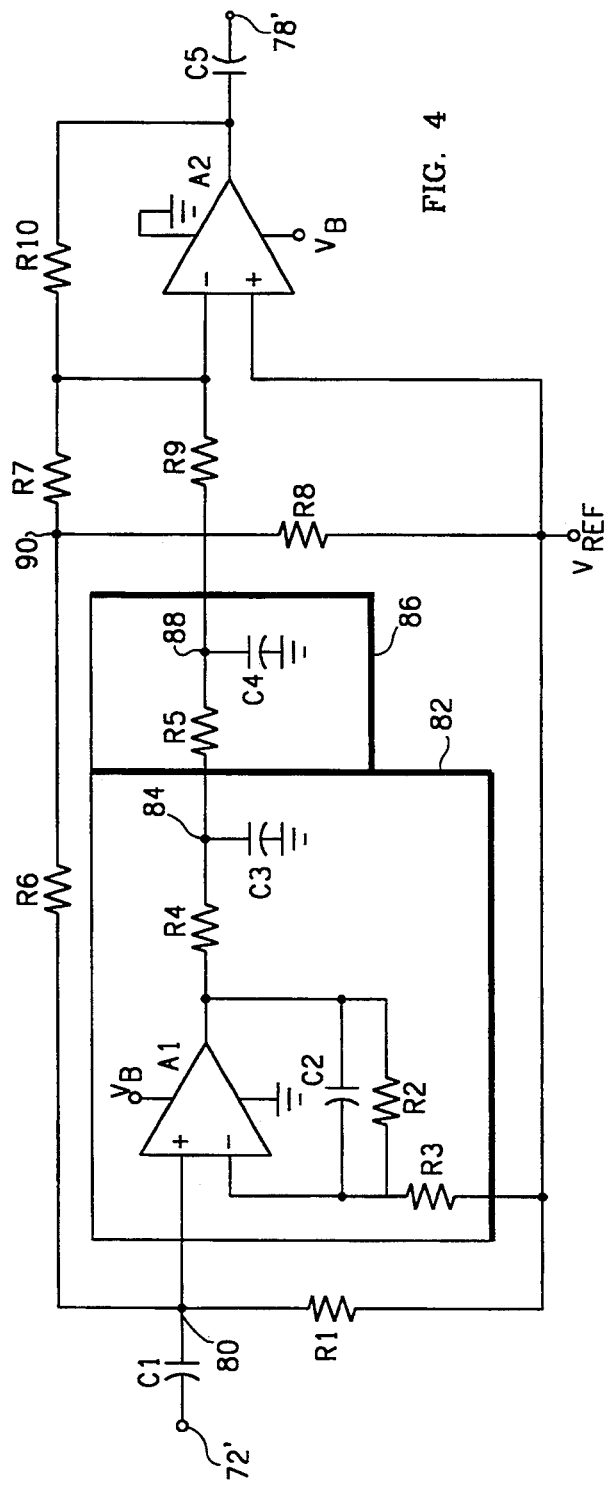
FIG. 4 is a schematic circuit diagram of the compensation circuit in one preferred embodiment of the frequency modulation circuit of FIG. 2.

Referring to FIG. 2, a preferred embodiment of a phase-locked loop frequency modulation circuit according to the present invention includes a voltage controlled oscillator (VCO) 40, a frequency divider 42, a phase detector 44, a loop filter 46, a first adder 48 and a compensation circuit 50. The compensation circuit 50 includes an integrator 52, a second filter 54 and a second adder 56. The integrator 52 has a gain A. The second filter 54 has the same transfer function as the loop filter 46.

The VCO 40 provides an output signal 60 (as shown in FIG. 3A) having a given frequency in accordance with the voltage of a control signal 62 provided to the input of the VCO 40. The frequency divider 42 divides the given frequency of the VCO output signal 60 by an integer N to provide a frequency-divided VCO output signal 64 having a frequency that is near the frequency $f_{REF}$ of a reference frequency signal 66. The phase detector 44 compares the phase of the frequency-divided VCO output signal 64 with the phase of the reference frequency signal 66 to provide a phase error signal 68 (as shown in FIG. 3B) that is indicative of a phase difference between the reference frequency signal 66 and the VCO output signal 60. The loop filter 46 filters the phase error signal 28 to provide a loop filter output signal 70 (as shown in FIG. 3C).

Referring to the compensation circuit 50, the integrator 52 integrates an input modulation signal 72 (as shown in FIG. 3D) and the second filter 54 filters the integrated input modulation signal 74 to provide a conversion signal 76 (as shown in FIG. 3E). The second adder 56 adds the conversion signal 76 to the input modulation signal 72 to provide a compensation signal 78 (as shown in FIG. 3F).

The first adder 48 adds the loop filter output signal 70 to the compensation signal 78 to provide the control signal 62 that is provided to the input of the VCO 40 to frequency modulate the output signal 60 that is provided by the VCO 40 at the given frequency.

In one preferred embodiment, the compensation circuit 50 does not include a combination of the discrete integrator 52, the second filter 54 and the second adder 56 shown in FIG. 2, but rather is constructed as shown in FIG. 4 for processing an input modulation signal provided at an input terminal 72' to provide a compensation signal at an output terminal 78'.

The compensation circuit of FIG. 4 includes a capacitance C1 connected between an input terminal 72' and a node 80; a resistance R1 connected between the node 80 and a reference voltage terminal $V_{REF}$; a filter section 82 that includes an operational amplifier A1 having its non-inverting input terminal connected to the node 80, a capacitance C2 connected between the output terminal and the inverting input terminal of the operational amplifier A1, a resistance R2 connected in parallel with the capacitance C2, a resistance R3 connected between the inverting input terminal of the operational amplifier A1 and the reference voltage terminal $V_{REF}$, a resistance R4 connected between the output terminal of the operational amplifier A1 and a node 84, and a capacitance C3 connected between the node 86 and circuit ground; a low pass filter 86 that includes a resistance R5 connected between the node 84 and a node 88, and a capacitance C4 connected between the node 88 and circuit ground; an operational amplifier A2 having its non-inverting input terminal connected to the reference voltage terminal $V_{REF}$, a resistance R6 connected between the node 80 and a node 90; a resistance R7 connected between the node 90 and the inverting input terminal of the operational amplifier A2; a resistance R8 connected between the node 90 and the reference voltage terminal $V_{REF}$; a resistance R9 connected between the node 88 and the inverting input terminal of the operational amplifier A2; a resistance R10 connected between the output terminal and the inverting input terminal of the operational amplifier A2 and a capacitance C5 connected between the output terminal of the operational amplifier A2 and the compensation circuit output terminal 78'.

Figure 5:
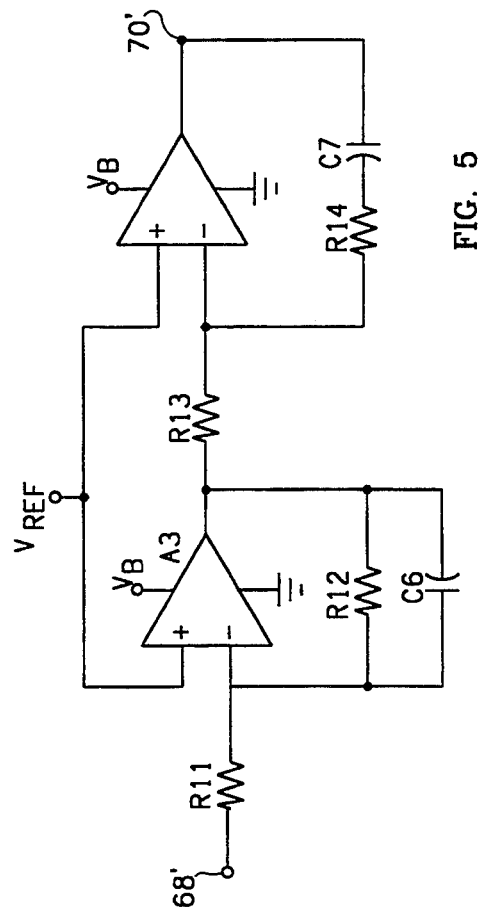
FIG. 5 is a schematic circuit diagram of the loop filter in said one preferred embodiment of the frequency modulation circuit of FIG. 2.

In the embodiment that includes the compensation circuit of FIG. 4, the loop filter is constructed as shown in FIG. 5. The loop filter of FIG. 5 includes an operational amplifier A3 having its non-inverting input terminal connected to the reference voltage terminal $V_{REF}$, a resistance R11 connected between the input node 68' and the inverting input terminal of the operational amplifier A3, a resistance R12 connected between the output terminal and the inverting input terminal of the operational amplifier A3, and a capacitance C6 connected in parallel with the resistance R12, an operational amplifier A4 having its non-inverting input terminal connected to the reference voltage terminal $V_{REF}$, a resistance R13 connected between the output terminal of the operational amplifier A3 and the inverting input terminal of the operational amplifier A4, and a series combination of a capacitance C7 and a resistance R14 connected between the output terminal and the inverting input terminal of the operational amplifier A4.

The compensation circuit of FIG. 4 processes an input modulation signal 72 provided at the input terminal 72' to provide the same effect as adding the input modulation signal 72 to an integrated input modulation signal that is filtered by a filter having the same transfer function as the loop filter 46 to provide the compensation signal 78.

The loop filter shown in FIG. 5 has a predetermined transfer function f(s); and the filter section 82 of the compensation circuit shown in FIG. 4 has the same predetermined transfer function f(s).

The combination of the resistance R5 and the capacitance C4 included in the low pass filter 84 of the compensation circuit of FIG. 4 integrates the filtered input modulation signal presented at node 86 to provide a conversion signal at node 88. The gain A of the compensation circuit of FIG. 4 is determined by the value of the resistance R8. The conversion signal is provided from the node 88 via the resistance R9 to the input terminal of the operational amplifier A2 where the conversion signal is added to the input modulation signal, which is provided from the input terminal 72' to the input terminal of the operational amplifier A2 via the capacitance C1, resistance R6 and resistance R7.

While the above description contains many specificities, these should not be construed as limitations on the scope of the present invention, but rather as exemplifications of the preferred embodiments described herein. Other variations are possible and the scope of the present invention should be determined not by the embodiments described herein but rather by the claims and their legal equivalents.

We claim:

1. A frequency-modulation circuit, comprising:
   a phase-locked loop, including
      a voltage controlled oscillator (VCO) for providing an output signal having a given frequency;
      means for adding a compensation signal to a loop filter output signal to provide a control signal to the VCO for controlling the frequency of the VCO output signal;
      means for processing an output signal from the VCO with a frequency reference signal to provide a phase error signal indicative of a phase difference between the reference frequency signal and the VCO output signal; and
      a loop filter having a predetermined transfer function for filtering the phase error signal to provide the loop filter output signal that is added to the compensation signal; and
   a compensation circuit for processing an input modulation signal to provide the compensation signal that is added to the loop filter output signal by processing the input modulation signal to provide the same effect as adding the input modulation signal to an integrated input modulation signal that is filtered by a filter having said predetermined transfer function to provide the compensation signal.

2. A circuit according to claim 1, wherein the compensation circuit comprises:
   means fix integrating the input modulation signal;
   a filter having said predetermined transfer function for filtering the integrated input modulation signal to provide a conversion signal; and
   means for adding the conversion signal to the input modulation signal to provide the compensation signal.

3. A circuit according to claim 1, wherein the compensation circuit includes a filter section having said predetermined transfer function coupled to a low pass filter for said processing of the input modulation signal, wherein the low pass filter is adapted for integrating the input modulation signal.

* * * * *

UNITED STATES PATENT AND TRADEMARK OFFICE
CERTIFICATE OF CORRECTION

PATENT NO. : 5,412,353
DATED : May 2, 1995
INVENTOR(S) : CHAPLIK, ET AL.

It is certified that error appears in the above-indentified patent and that said Letters Patent is hereby corrected as shown below:

Column 1, line 61, that portion of Eq. 1 reading "$\Delta\omega(a)$" should read --$\Delta\omega(s)$--.

Column 2, line 8, that portion of Eq. 2 reading "$[1 + K_o K_d\ f)s) / s]$" should read --$[1 + K_o K_d\ f(s) / s]$--.

Column 6, line 33, "fix" should read --for--.

Signed and Sealed this

Twenty-second Day of August, 1995

Attest:

BRUCE LEHMAN

Attesting Officer     Commissioner of Patents and Trademarks